(12) United States Patent
Tashiro et al.

(10) Patent No.: US 10,098,247 B2
(45) Date of Patent: Oct. 9, 2018

(54) ELECTRIC CONNECTION BOX AND WIRE HARNESS

(71) Applicant: Yazaki Corporation, Tokyo (JP)

(72) Inventors: Hiroki Tashiro, Shizuoka (JP); Nobutaka Kaneko, Shizuoka (JP); Keiichi Sugiyama, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/728,612

(22) Filed: Oct. 10, 2017

(65) Prior Publication Data
US 2018/0103556 A1 Apr. 12, 2018

(30) Foreign Application Priority Data
Oct. 12, 2016 (JP) ................... 2016-200791

(51) Int. Cl.
| H05K 5/02 | (2006.01) |
| H01B 7/00 | (2006.01) |
| H05K 5/03 | (2006.01) |
| H05K 5/00 | (2006.01) |
| B60R 16/023 | (2006.01) |

(52) U.S. Cl.
CPC ....... H05K 5/0217 (2013.01); B60R 16/0238 (2013.01); H01B 7/0045 (2013.01); H05K 5/0047 (2013.01); H05K 5/0213 (2013.01); H05K 5/03 (2013.01)

(58) Field of Classification Search
CPC ....... H05K 5/0217; H05K 5/03; H01B 7/0045
See application file for complete search history.

(56) References Cited

U.S. PATENT DOCUMENTS 6,610,927 B2 * 8/2003 Dinh .................. H02G 3/088
174/66
2014/0311793 A1 10/2014 Kaneko et al.

FOREIGN PATENT DOCUMENTS

| JP | 2013-146125 A | 7/2013 |
| JP | 2015-115972 A | 6/2015 |

* cited by examiner

*Primary Examiner* — Dhiru R Patel
(74) *Attorney, Agent, or Firm* — Sughrue Mion, PLLC

(57) ABSTRACT

An electric connection box includes a rib that partitions an internal space portion of a casing into a first housing region and a second housing region, a water collection section, and a water passage section. The water passage section is formed by a rib main body portion and water passage walls, an upward side end portion communicates with the water collection section, and a downward side end portion communicates with the outside of the casing. The water passage walls are connected to the guide walls of the water collection section, respectively, and have inclination downward toward a connection location. The guide walls overlap an upward side end portion boundary Ru as viewed in the vertical direction and are disposed on the upward side of the first housing region and the second housing region.

5 Claims, 7 Drawing Sheets

FIG.8
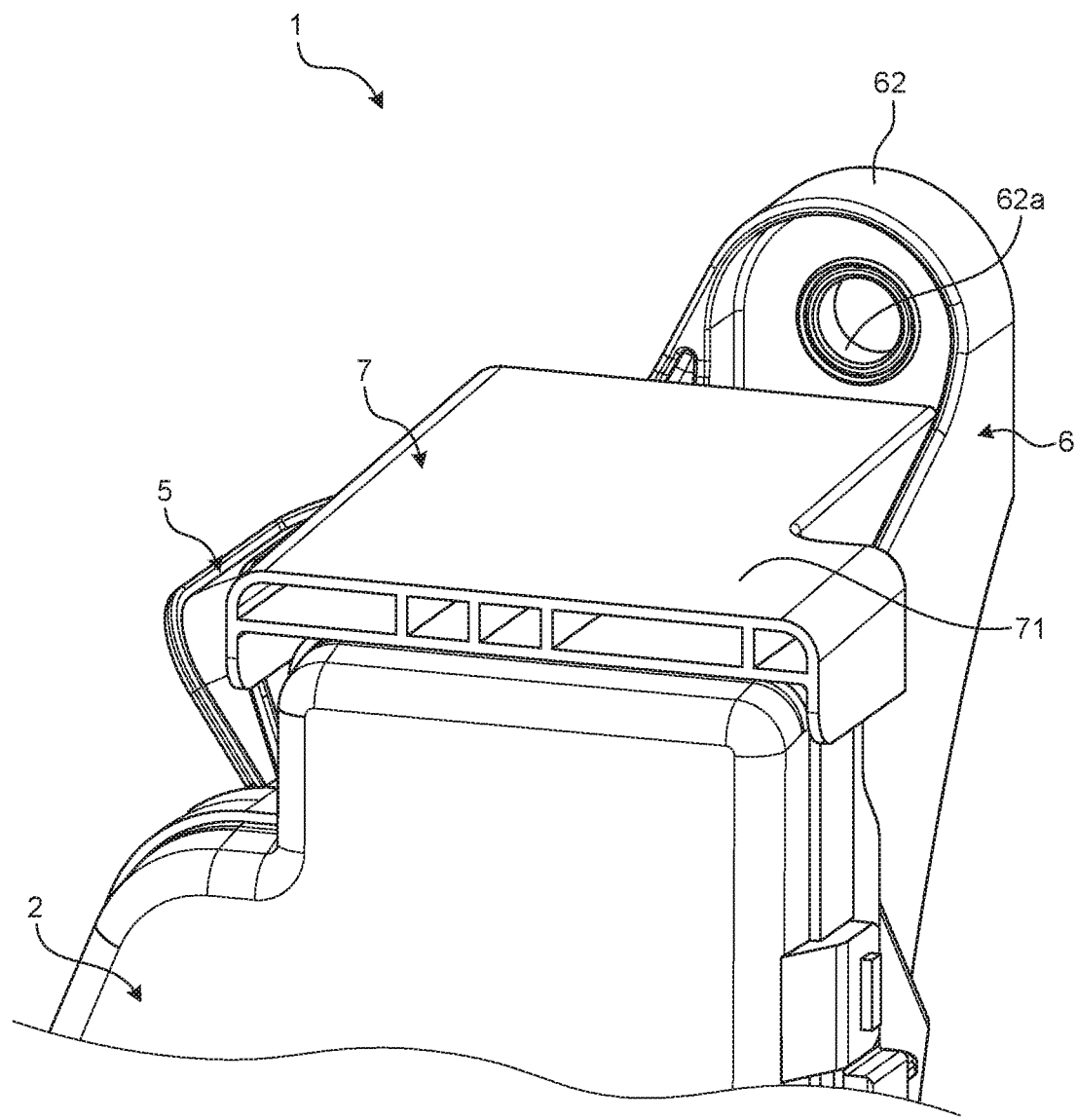
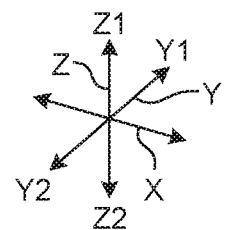

ELECTRIC CONNECTION BOX AND WIRE HARNESS

CROSS-REFERENCE TO RELATED APPLICATIONS

The present application claims priority to and incorporates by reference the entire contents of Japanese Patent Application No. 2016-200791 filed in Japan on Oct. 12, 2016.

BACKGROUND OF THE INVENTION

1. Field of the Invention

The present invention relates to an electric connection box and a wire harness.

2. Description of the Related Art

In an electric connection box which includes a casing having an internal space portion that houses a plurality of electronic components and an opening portion, and a cover that closes the opening portion of the casing, a boundary between the casing and the cover is formed by making one round in a closing direction of the cover with respect to the opening portion of the casing. Generally, the electric connection box is installed on an installation target such that the closing direction of the cover with respect to the opening portion of the casing is a vertical direction.

Meanwhile, there is an electric connection box installed on the installation target so that the closing direction is a direction orthogonal to the vertical direction. In the electric connection box in which the closing direction is a direction orthogonal to the vertical direction, a portion which is located at an end portion on an upward side, of the boundary between the casing and the cover is formed on an end surface on the upward side of the electric connection box (see Japanese Patent Application Laid-open Nos. 2015-115972 and 2013-146125).

In the electric connection box which includes the casing and the cover, there is a case that liquid may adhere to an outer side surface of the electric connection box. In the electric connection box in which the closing direction is a direction orthogonal to the vertical direction, when liquid adheres to the end surface on the upward side of the outer side surface of the electric connection box, as compared with an electric connection box in which the vertical direction is the closing direction, there is a concern that the adhered liquid enters an internal space portion from a portion which is formed on the end surface on the upward side of the electric connection box, of the boundary between the casing and the cover. There is a possibility that the liquid is entered the internal space portion by dropping downward from the boundary to the internal space portion in the vertically downward direction.

Incidentally, in the electric connection box in which the closing direction is a direction orthogonal to the vertical direction, electronic components are disposed on the downward side with respect to the boundary formed at the end portion on the upward side of the electric connection box, in the internal space portion. Therefore, in the electric connection box in which the direction orthogonal to the vertical direction is the closing direction, there is a need for a countermeasure against the electronic components in a case where the liquid enters the internal space portion.

SUMMARY OF THE INVENTION

The present invention has been made in view of the above problems, and an object thereof is to provide an electric connection box and a wire harness capable of suppressing dropping of liquid when liquid enters an internal space portion in the electric connection box in which a closing direction of a cover with respect to an opening portion of a casing is orthogonal to a vertical direction.

In order to achieve the above mentioned object, an electric connection box according to one aspect of the present invention includes a casing that includes an internal space portion and a cover side opening portion that communicates with the internal space portion, a plurality of electronic components housed in the internal space portion, and a cover that closes the cover side opening portion, wherein the casing is installed on an installation target such that a closing direction of the cover with respect to the cover side opening portion is a direction orthogonal to a vertical direction, the internal space portion is partitioned into a first housing region and a second housing region by a rib formed on the casing to extend in the vertical direction, in a width direction orthogonal to the vertical direction and the closing direction, the rib extends in an opening direction side which is a direction opposite to the closing direction, and includes a water passage section formed by a water passage wall opposed in the width direction, of both end portions of the water passage section in the vertical direction, an upward side end portion communicates with a water collection section provided in the casing, and a downward side end portion communicates with an outside of the casing, and the water collection section includes a guide wall which overlaps an upward side end portion boundary which is a boundary located at an upward side end portion, of the boundary between the casing and the cover as viewed in the vertical direction, the guide wall being disposed on the upward side of the first housing region and the second housing region, and connected to the water passage wall.

According to another aspect of the present invention, the electric connection box may further include a water shielding member which is disposed on an upward side in the vertical direction further than the upward side end portion boundary, and at least a part of which overlaps the upward side end portion boundary as viewed in the vertical direction.

According to still another aspect of the present invention, in the electric connection box, the water shielding member may be an inclined surface in which an upward side end surface in the vertical direction is inclined downward from a closing direction side end portion toward an opening direction side end portion.

According to still another aspect of the present invention, in the electric connection box, the casing may include an extension portion extending from the closing direction side of the water shielding member toward the upward direction side further than the water shielding member, and the extension portion may be formed such that an end portion water shielding section at least overlapping the closing direction side end portion of the water shielding member protrudes in the opening direction as viewed in the vertical direction.

A wire harness according to still another aspect of the present invention includes an electric wire, and an electric connection box that includes a casing having an internal space portion and a cover side opening portion communicating with the internal space portion, a plurality of electronic components housed in the internal space portion, and a cover that closes the cover side opening portion, wherein the casing is installed on an installation target such that a closing direction of the cover with respect to the cover side opening portion is a direction orthogonal to a vertical direction, the internal space portion is partitioned into a first housing region and a second housing region by a rib formed on the casing to extend in the vertical direction, in a width direction orthogonal to the vertical direction and the closing direction, the rib extends in an opening direction side which is a direction opposite to the closing direction, and includes a water passage section formed by a water passage wall opposed in the width direction, of both end portions of the water passage section in the vertical direction, an upward side end portion communicates with a water collection section provided in the casing, and a downward side end portion communicates with an outside of the casing, and the water collection section includes a guide wall which overlaps an upward side end portion boundary which is a boundary located at an upward side end portion, of a boundary between the casing and the cover as viewed in the vertical direction, the guide wall being disposed on the upward side of the first housing region and the second housing region, and connected to the water passage wall.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 8 is a partial perspective view of an electric connection box according to a modified example.

DETAILED DESCRIPTION OF THE PREFERRED EMBODIMENTS

Hereinafter, embodiments of an electric connection box and a wire harness according to the present invention will be described in detail with reference to the accompanying drawings. It should be noted that the invention is not limited to the embodiments. Further, constituent elements in the following embodiments include those which can be easily assumed by those skilled in the art or substantially the same. Further, various omissions, substitutions, and changes can be made to the constituent elements in the embodiments below within the scope that does not depart from the gist of the invention.

First Embodiment

Figure 1:
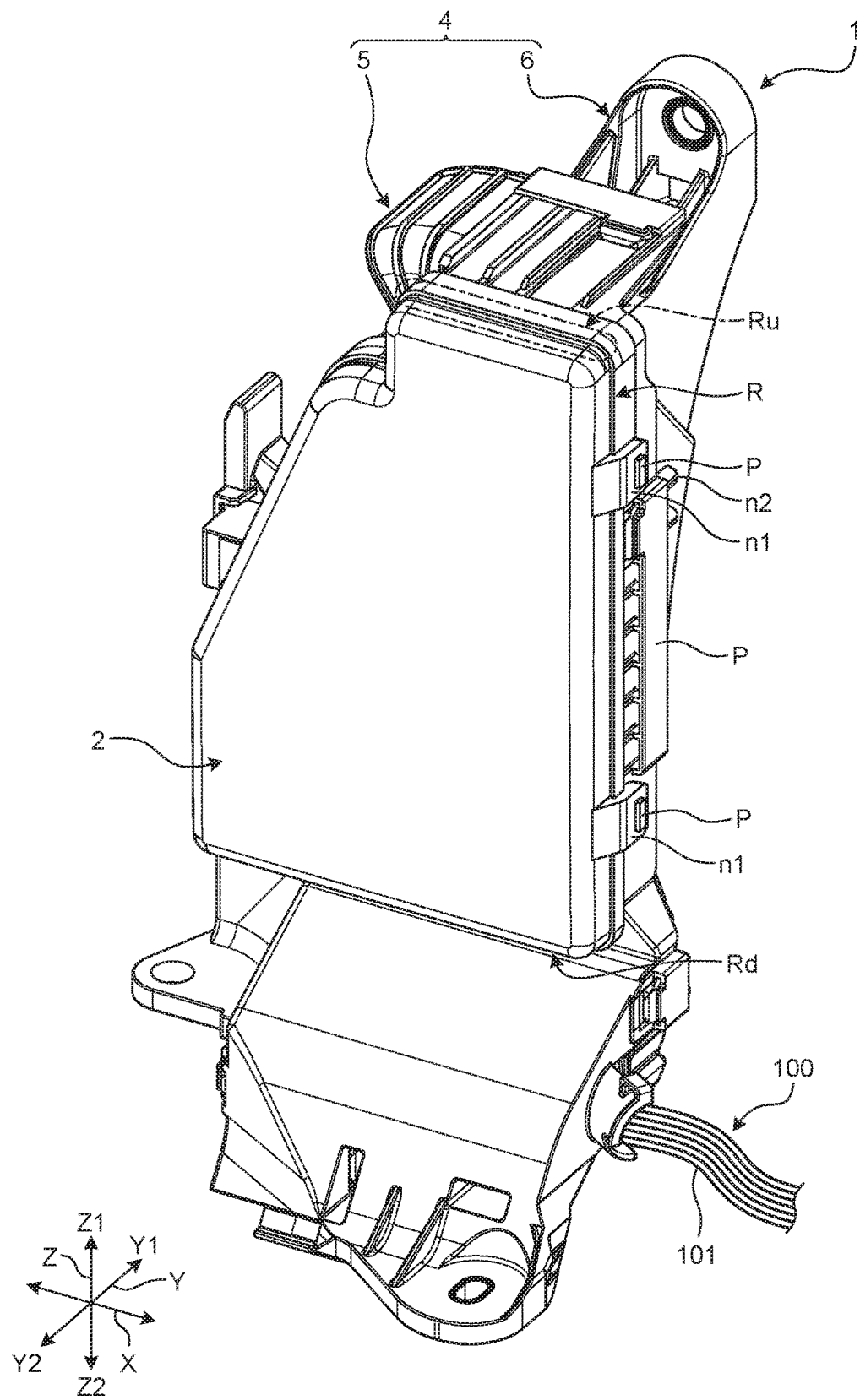
FIG. 1 is a perspective view of an electric connection box and a wire harness according to a first embodiment.
Figure 2:
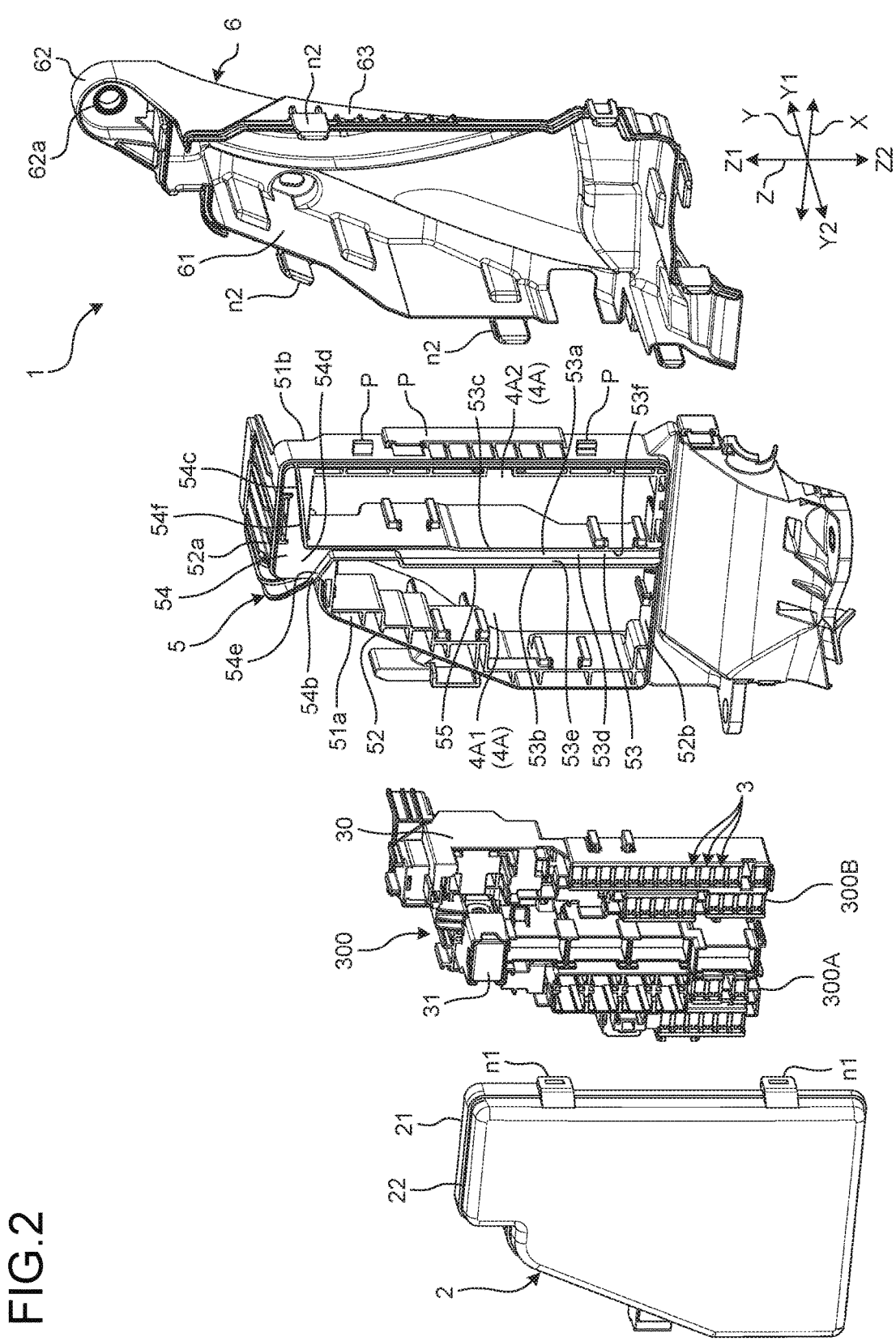
FIG. 2 is an exploded perspective view of the electric connection box according to the first embodiment.
Figure 3:
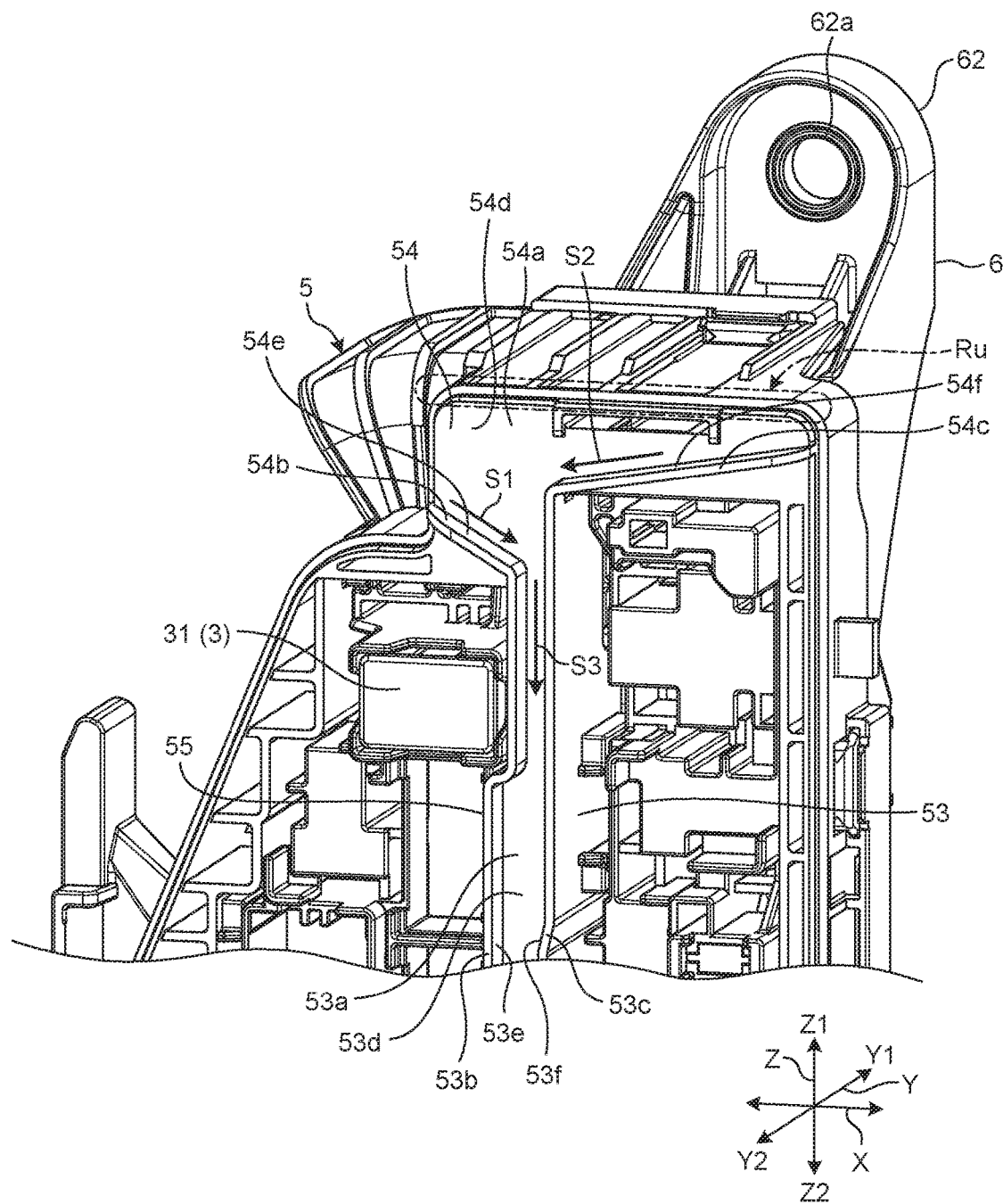
FIG. 3 is a perspective view in which a cover is detached from the electric connection box according to the first embodiment.
Figure 4:
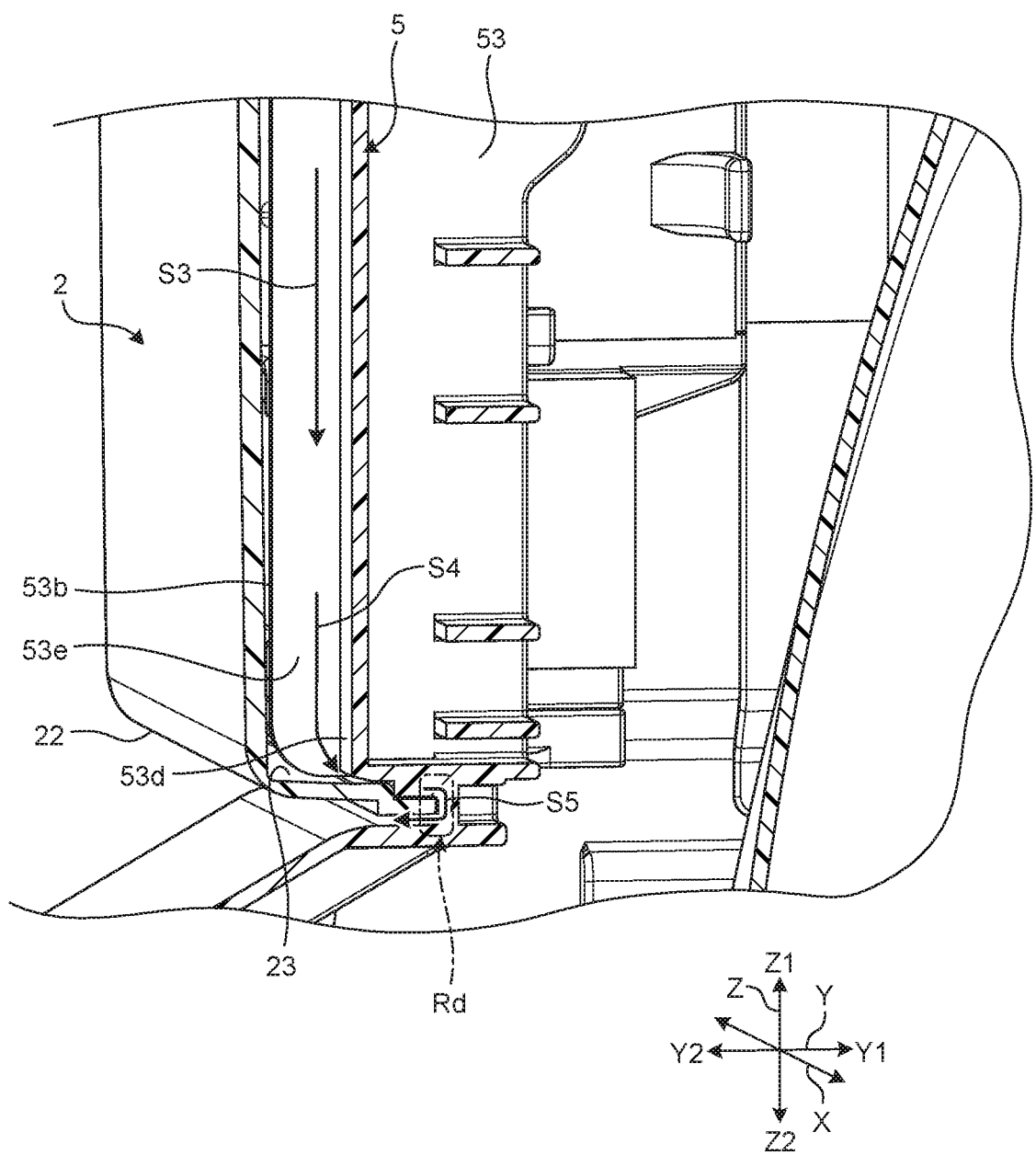
FIG. 4 is a partial cross-sectional view of the electric connection box according to the first embodiment.

An electric connection box and a wire harness according to the first embodiment will be first described. FIG. 1 is a perspective view of an electric connection box and a wire harness according to a first embodiment. FIG. 2 is an exploded perspective view of the electric connection box according to the first embodiment. FIG. 3 is a view in which the cover is detached from the electric connection box according to the first embodiment. FIG. 4 is a partial cross-sectional view of the electric connection box according to the first embodiment. Here, an X direction shown in each drawing is a width direction of the electric connection box. A Y direction in each drawing is a direction orthogonal to the X direction and is a depth direction of the electric connection box. A Y1 direction is a closing direction of the cover with respect to a casing opening portion. A Y2 direction is an opening direction of the cover with respect to the casing opening portion. A Z direction is a direction orthogonal to the X direction and the Y direction and is an up-down direction of the electric connection box. In the present embodiment, the vertical direction is the up-down direction of the electric connection box. A Z1 direction is an upward direction. A Z2 direction is a downward direction.

As illustrated in FIG. 1, an electric connection box 1 is incorporated in a wire harness 100 mounted on a vehicle and routed to the vehicle, and collects and houses various electronic component modules such as a connector, a fuse, a relay, and an electrical components such as an electronic control unit that constitute a connection processing component such as an electric wire(s) 101. In some cases, the electric connection box 1 may also be referred to as a junction box, a fuse box, a relay box or the like, but in the present embodiment, they are collectively referred to as an electric connection box. The electric connection box 1 includes a cover 2, a plurality of electronic components 3, and a casing 4. The casing 4 includes a casing main body 5 and a casing cover 6.

As illustrated in FIGS. 1 and 2, in the electric connection box 1, an electronic component block 300 constituted by an electronic component 3 and an electronic component case 30 is inserted into an internal space portion 4A to be described later, that is, inside the casing main body 5, and the electronic component block 300 is locked to the casing main body 5 by locking portions formed on each of an inner circumferential surface of the casing main body 5 and an outer circumferential surface of the electronic component case 30. Further, with respect to the casing main body 5 that houses the electronic component 3, the cover 2 closes a cover side opening portion 51a (described later) of the casing 4 from the closing direction, and the casing cover 6 closes a casing cover side opening portion 51b to be described later of the casing 4 from the opening direction. The cover 2 and the casing cover 6 have locking claws n1 and n2 provided on an outer circumferential surface thereof, respectively, and by engaging with lock receiving portions P provided on an outer circumferential surface of the casing main body 5, the cover 2 and the casing cover 6 are locked with the casing main body 5, and the electric connection box 1 is assembled.

Here, in the electric connection box 1, a boundary R between the casing 4 and the cover 2 is formed. The boundary R is an end portion in which the casing 4 and the cover 2 face each other when the cover 2 closes the casing 4, that is, a joint portion between the casing 4 and the cover 2. In the present embodiment, the boundary R is formed such that the outer circumferential surface of the outer circumferential wall of the casing 4 and the inner circumferential surface of the outer circumferential wall of the cover 2 face each other in a direction orthogonal to the closing direction. Therefore, as illustrated in FIG. 1, the boundary R is formed to make one round in the circumferential direction when the closing direction is defined as an axis. The boundary R includes an upward side end portion boundary Ru (a region surrounded by a dotted line in FIG. 1) located at an upward side end portion and a downward side end portion boundary Rd located at a downward side end portion. The upward side end portion boundary Ru and the downward side end portion boundary Rd extend in the width direction, respectively, and face each other in the vertical direction.

As illustrated in FIGS. 1 and 2, the cover 2 closes the cover side opening portion 51a of the casing main body 5 from the closing direction. The cover 2 is formed in a tray (dish) shape having an opening portion 21. The cover 2 is formed so that, when attached to the casing main body 5, an outer circumferential wall 22 located in the circumferential direction is located outside an outer circumferential wall 52 of the casing main body 5 when the closing direction is defined as the axis. In the cover 2, a plurality of locking claw portions n1 is formed on the outer circumferential surface of the outer circumferential wall 22.

As illustrated in FIG. 2, the electronic component 3 is housed in the internal space portion 4A in a state housed in the electronic component case 30 formed of a synthetic resin or the like. In the electronic component case 30, a plurality of partition walls is formed, and the electronic components 3 are housed individually by the partition walls. By housing the electronic component 3 in the electronic component case 30, the plurality of electronic components 3 constitutes an electronic component block 300 as single aggregate. In the present embodiment, two electronic component blocks 300 are formed, in this case, one electronic component block 300A is housed in a first housing region 4A1 to be described later, and the other electronic component block 300B is housed in a second housing region 4A2 to be described later. The electronic component 3 is disposed so that the main body portion 31 of the electronic component 3 is located on the cover 2 side, and an electric wire (not illustrated) connected to the electronic component 3 is located on the casing cover 6 side, when housed in the internal space portion 4A.

The casing 4 is formed of a synthetic resin or the like, and is formed in a box shape having the internal space portion 4A by the casing main body 5 and the casing cover 6. As illustrated in FIG. 2, the casing 4 houses a plurality of electronic components 3, that is, the electronic component block 300, in the internal space portion 4A. The casing 4 is installed on an installation target so that the closing direction of the cover 2 with respect to a cover side opening portion 51a (to be described later) is a direction orthogonal to the vertical direction. The electric connection box 1 according to the present embodiment is installed, in a space portion in which the installation target exists, in a location in which there is no space installing an electric connection box where the closing direction of the cover to the casing is the vertical direction and having a length in the width direction as in the conventional art, and which allows a space that disposes the electric connection box in the vertical direction, for example, in a luggage room. In the present embodiment, the electric connection box 1 is installed on a bottom plate of a luggage room (not illustrated).

The internal space portion 4A is formed by closing the casing main body 5 using the casing cover 6. The internal space portion 4A is partitioned into two regions in the width direction, that is, a first housing region 4A1 and a second housing region 4A2 by a rib 53 to be described later as viewed in the closing direction. The first housing region 4A1 and the second housing region 4A2 are partitioned by the rib 53, a water collection section main body 54a to be described later, and the outer circumferential wall 52 of the casing main body 5 as viewed in the closing direction.

The casing main body 5 includes a cover side opening portion 51a communicating with the internal space portion 4A. The casing main body 5 has a casing cover side opening portion 51b which faces the cover side opening portion 51a in the closing direction and communicates with the internal space portion 4A. That is, the casing main body 5 is formed in a rectangular frame shape by the outer circumferential wall 52 as viewed in the closing direction. The outer circumferential surface 52a at the upward side end portion of the outer circumferential wall 52 of the casing main body 5 is an inclined surface which is inclined downward from the closing direction side end portion of the casing main body 5 toward the opening direction side end portion. The casing main body 5 includes the plurality of lock receiving portions P fitted to the locking claw portions n1 and n2 of the cover 2 and the casing cover 6 on the outer circumferential surface of the outer circumferential wall 52. The casing main body 5 includes a rib 53 and a water collection section 54.

The rib 53 partitions the internal space portion 4A into the first housing region 4A1 and the second housing region 4A2. The rib 53 is formed at the central portion in the width direction of the casing main body 5. The rib 53 is formed to extend in the vertical direction from the water collection section 54 formed on the upward side to the inner circumferential surface of the outer circumferential wall 52 located on the downward side end portion of the outer circumferential wall 52 of the casing main body 5, that is, the inner circumferential surface 52b of the downward side end portion. The rib 53 has a rib main body portion 53a, and water passage walls 53b and 53c.

The rib main body portion 53a is formed to extend toward the closing direction as viewed in the width direction. The water passage walls 53b and 53c are formed to protrude from both end portions in the width direction of the end surface 53d on the opening direction side of the rib main body portion 53a, that is, on the cover 2 side, and to extend in the opening direction. Therefore, the pair of water passage walls 53b and 53c faces each other in the width direction. The water passage walls 53b and 53c protrude at least in the opening direction side from the outer circumferential wall 52 of the casing main body 5 as viewed in the width direction, and are formed to extend in the opening direction so as to be located on the same plane in the vertical direction as the electronic component 3 housed in the internal space portion 4A. The downward side end portions of the water passage walls 53b and 53c are connected to the inner circumferential surface 52b of the downward side end portion of the casing main body 5.

The facing surfaces 53e and 53f facing each other in the water passage walls 53b and 53c are connected to the end surface 53d of the rib main body portion 53a, respectively. That is, a water passage section 55 is constituted by the rib main body portion 53a and the water passage walls 53b and 53c, that is, the end surface 53d of the rib main body portion 53a and the facing surfaces 53e and 53f of the water passage walls 53b and 53c. When the cover 2 is attached to the casing main body 5, the water passage section 55 is constituted by an inner circumferential surface at an end portion on the closing direction side of the outer circumferential wall of the cover 2, the end surface 53d, and the pair of facing surfaces 53e and 53f. The water passage section 55 guides liquid such as water, which has entered the internal space portion 4A from the boundary R between the casing 4 and the cover 2, downward in the vertical direction. As illustrated in FIGS. 2 and 3, the upward side end portion of the both end portions of the water passage section 55 in the vertical direction communicates with the water collection section 54, and the downward side end portion thereof communicates with the external space of the casing 4 via the downward side end portion boundary Rd.

The water collection section 54 collects the liquid that has entered the internal space portion 4A from the boundary R between the casing 4 and the cover 2, that is, the upward side end portion boundary Ru, and guides the liquid to the water passage section 55. As illustrated in FIGS. 3 and 4, the water collection section 54 has a water collection section main body 54a, and a plurality of guide walls 54b and 54c. The water collection section main body 54a is connected to the inner circumferential surface of the outer circumferential wall 52 located at the upward end portion of the outer circumferential wall 52 of the casing main body 5, and the inner circumferential surface of a part of the outer circumferential wall 52 located at both end portions in the width direction of the outer circumferential wall 52 of the casing main body 5 as viewed in the closing direction. Further, the downward side end portion of the water collection section main body 54a forms a part of the upward side of the first housing region 4A1 and the second housing region 4A2 with the rib 53 interposed therebetween in the width direction. The opening direction side of the water collection section main body 54a, that is, the end surface 54d on the side of the cover 2 is connected to the end surface 53d of the rib main body portion 53a. Here, the end surface 54d and the end surface 53d are connected so as to be located on the same plane orthogonal to the closing direction. Therefore, the water collection section 54 and the water passage section 55 are formed continuously.

The guide walls 54b and 54c are formed to protrude from the end surface 54d of the water collection section main body 54a and to extend in the opening direction. The guide walls 54b and 54c overlap the upward side end portion boundary Ru as viewed in the vertical direction. In the guide walls 54b and 54c, the guide wall 54b is disposed on the upward side of the first housing region 4A1 as viewed in the closing direction, and the guide wall 54c is disposed on the upward side of the second housing region 4A2 side. As illustrated in FIG. 3, one end portion of both end portions of the guide wall 54b in the width direction is connected to one outer circumferential wall of the outer circumferential wall 52 of the casing main body 5 facing the width direction. The other end portion of the guide wall 54b is connected to the water passage wall 53b. That is, the end surface 54e on the upward side of the guide wall 54b is connected to the facing surface 53e of the water passage wall 53b. One end portion of the both end portions of the guide wall 54c in the width direction is connected to the other outer circumferential wall of the outer circumferential wall 52 of the casing main body 5 facing the width direction. The other end portion of the guide wall 54c is connected to the water passage wall 53c. That is, the end surface 54f on the upward side of the guide wall 59b is connected to the facing surface 53f of the water passage wall 53c. The guide walls 54b and 54c are formed to be inclined downward from one end portion toward the other end portion as viewed in the closing direction, in other words, toward the connecting location with the water passage walls 53b and 53c, respectively.

The casing cover 6 closes the casing cover side opening portion 51b of the casing main body 5 from the opening direction. The casing cover 6 is formed in a box shape having an opening portion 61. The casing cover 6 has an attaching portion 62 for attaching the casing cover 6, that is, the electric connection box 1 to the bottom plate of the luggage room, at the end portion on the upward side. An attaching hole 62a through which a fastening member such as a bolt for attaching passes is formed in the attaching portion 62. The casing cover 6 is formed such that, at the time of being attached to the casing main body 5, the outer circumferential wall 63 located in the circumferential direction when defining the depth direction as the axis is located inside the outer circumferential wall 52 of the casing main body 5. In the casing cover 6, the plurality of locking claw portions n2 fitted with the lock receiving portions P of the casing main body 5 is formed on the outer circumferential surface of the outer circumferential wall 63.

Next, the flow of liquid in a case where the liquid is applied to the electric connection box 1 according to the first embodiment from the outside will be described. First, when the liquid is applied to the upward side end portion of the electric connection box 1, that is, the outer circumferential surface 52a of the upward side end portion of the outer circumferential wall 52 of the casing main body 5, the liquid is guided in the opening direction side by the inclination of the outer circumferential surface 52a of the upward side end portion which is the inclined surface, and drops downward from the end portion of the cover 2 on the opening direction side to the outside of the electric connection box 1.

Next, an example of the flow of the liquid in a case where the liquid adhered to the outer circumferential surface 52a of the upward side end portion of the casing main body 5 enters the internal space portion 4A from the upward side end portion boundary Ru between the casing 4 and the cover 2 will be described with reference to FIGS. 3 and 4. The liquid that has passed between the inner circumferential surface of the outer circumferential wall 22 of the cover 2 and the outer circumferential surface of the outer circumferential wall 52 of the casing main body 5 at the upward side end portion boundary Ru and has entered the internal space portion 4A drops onto the internal space portion 4A downward in the vertical direction or moves downward along the end surface 54d of the water collection section main body 54a. The liquid moved in the downward direction adheres to the end surfaces 54e and 54f on the upward side of the guide walls 54b and 54c overlapping the upward side end portion boundary Ru as viewed in the vertical direction. The liquid dropped onto the guide wall 54b is collected to the downward side along the inclination of the guide wall 54b due to its own weight at the end surface 54e and is guided toward the water passage section 55 (arrow S1). The liquid dropped onto the guide wall 54c is collected to the downward side along the inclination of the guide wall 54c due to its own weight on the end surface 54f, and is guided toward the water passage section 55 (arrow S2). The liquid guided from the guide wall 54b and the guide wall 54c to the water passage section 55 is moved in the water passage section 55 to the downward side through one of the end surface 53d of the rib main body portion 53a and the facing surfaces 53e and 53f of the water passage walls 53b and 53c constituting the water passage section 55, and is guided downward (arrow S3). Also, as viewed in the vertical direction, even when the liquid enters the internal space portion 4A from the position at which the water passage section 55 is disposed on the downward side of the upward side end portion boundary Ru, the liquid is guided downward through the water passage section 55 (arrow S3).

As illustrated in FIG. 4, the liquid guided downward in the water passage section 55 reaches the end portion on the downward side of the water passage section 55. The liquid that has reached the end portion on the downward side moves from the downward side end surface of one of the end surface 53d of the rib main body portion 53a and the facing surfaces 53e and 53f of the water passage walls 53b and 53c to the inner circumferential surface 23 of the outer circumferential wall 22 located at the downward side end portion of the cover 2. The liquid that has reached the inner circumferential surface 23 flows into the downward side end portion boundary Rd (arrow S4), due to an increase in the amount of reaching liquid. The liquid that has flowed into the downward side end portion boundary Rd flows along the outer circumferential surface of the outer circumferential wall 52 of the casing main body 5 at the downward side end portion boundary Rd, and is discharged from a gap between the outer circumferential surface of the outer circumferential wall 52 of the casing main body 5 and the inner circumferential surface of the outer circumferential wall 22 of the cover 2 to the outside of the casing 4, that is, to the outside of the electric connection box 1 (arrow S5).

As described above, in the electric connection box 1 according to the first embodiment, the guide walls 54b and 54c accept the liquid having entered the internal space portion 4A from the upward side end portion boundary Ru, and guide the liquid to the water passage section 55 along the inclination of the guide walls 54b and 54c. The liquid guided to the water passage section 55 is guided vertically downward by the water passage section 55, reaches the end portion on the downward side of the water passage section 55, and is discharged from the downward side end portion boundary Rd to the outside of the electric connection box 1. The guide walls 54b and 54c are formed on the end surface 54d of the water collection section main body 54a at a position overlapping the upward side end portion boundary Ru as viewed in the vertical direction. Therefore, after the liquid having entered the internal space portion 4A from the upward side end portion boundary Ru moves downward due to its own weight, the liquid comes into contact with the end surfaces 54e and 54f of the guide walls 54b and 54c, is collected by the guide walls 54b and 54c, and is guided to the water passage section 55. Therefore, it is possible to prevent the liquid from dropping downward in the internal space portion 4A in the vertically downward direction, and since the liquid avoids the electronic component 3, the liquid can be prevented from adhering to the electronic component 3 disposed on the downward side of the upward side end portion boundary Ru. Further, since the liquid is guided downward in the vertical direction by the water passage section 55 having the water passage walls 53b and 53c disposed between the electronic component blocks 300A and 300B as viewed in the closing direction, the liquid can be discharged from the downward side end portion boundary Rd to the outside of the casing 4, while avoiding the electronic component 3.

Further, in the electric connection box 1 according to the first embodiment, since the rib 53 is formed between the first housing region 4A1 and the second housing region 4A2, that is, in the center portion in the width direction as viewed in the closing direction, rigidity of the casing 4 can be improved as compared with a case where the rib 53 is not formed. Since the rib 53 is formed between the first housing region 4A1 and the second housing region 4A2, the electronic component blocks 300A and 300B housed in each of the first housing region 4A1 and the second housing region 4A2 are disposed to be separated from each other. Thus, it is possible to suppress the influence of heat at the time of energization of the electronic component 3.

Further, the water collection section 54 and the water passage section 55 are formed on the cover 2 side with respect to the casing 4, that is, on the main body portion 31 side of the electronic component 3 as viewed in the width direction view, and the water collection section 54 and the water passage section 55 are formed to protrude in a direction opposite to the closing direction so as to be located on the same plane as the electronic component 3 in the vertical direction as viewed in the width direction. That is, since the water passage walls 53b and 53c and the guide walls 54b and 54c make waterproof with respect to the main body portion 31 at the position adjacent to the main body portion 31 affected by the adhesion of the liquid, it is possible to more reliably prevent the dropped liquid from adhering to the electronic component 3.

Further, since the wire harness 100 described above includes the electric connection box 1, the liquid that has entered the internal space portion 4A from the upward side end portion boundary Ru is collected in the water collection section 54, is guided downward by the water passage section 55 and is discharged to the outside of the casing 4, it is possible to prevent the liquid from dropping vertically downward in the internal space portion 4A and from adhering to the electronic component 3.

Second Embodiment

Figure 5:
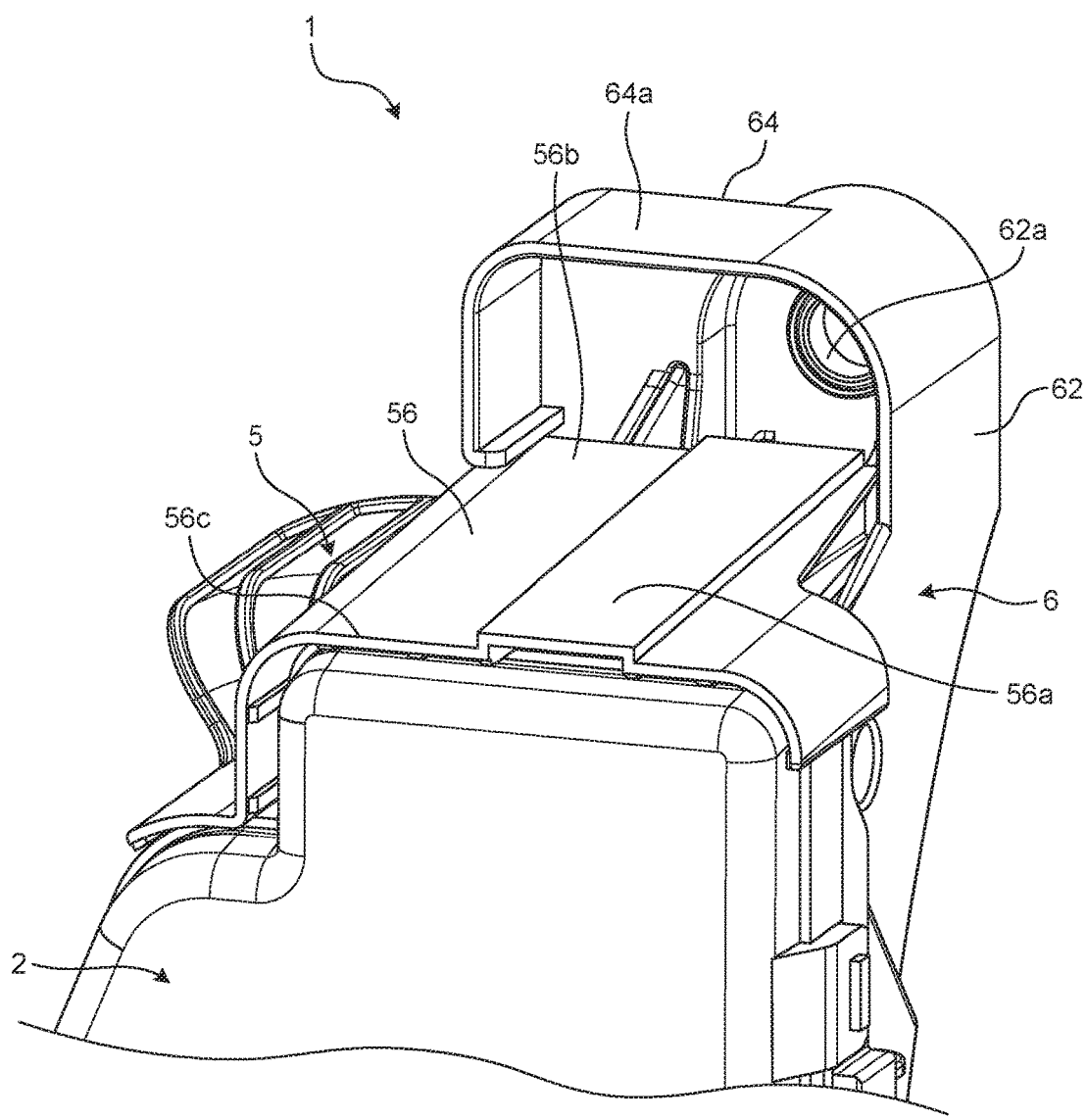
FIG. 5 is a partial perspective view of an electric connection box according to a second embodiment.
Figure 6:
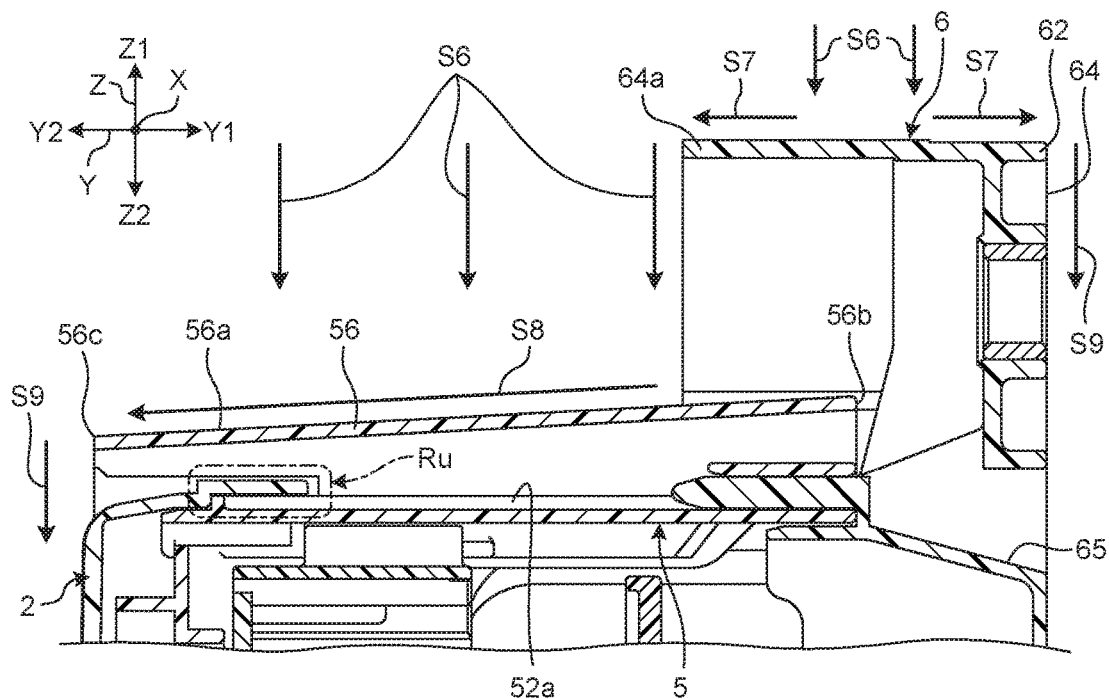
FIG. 6 is a partial cross-sectional view of the electric connection box according to the second embodiment.
Figure 7:
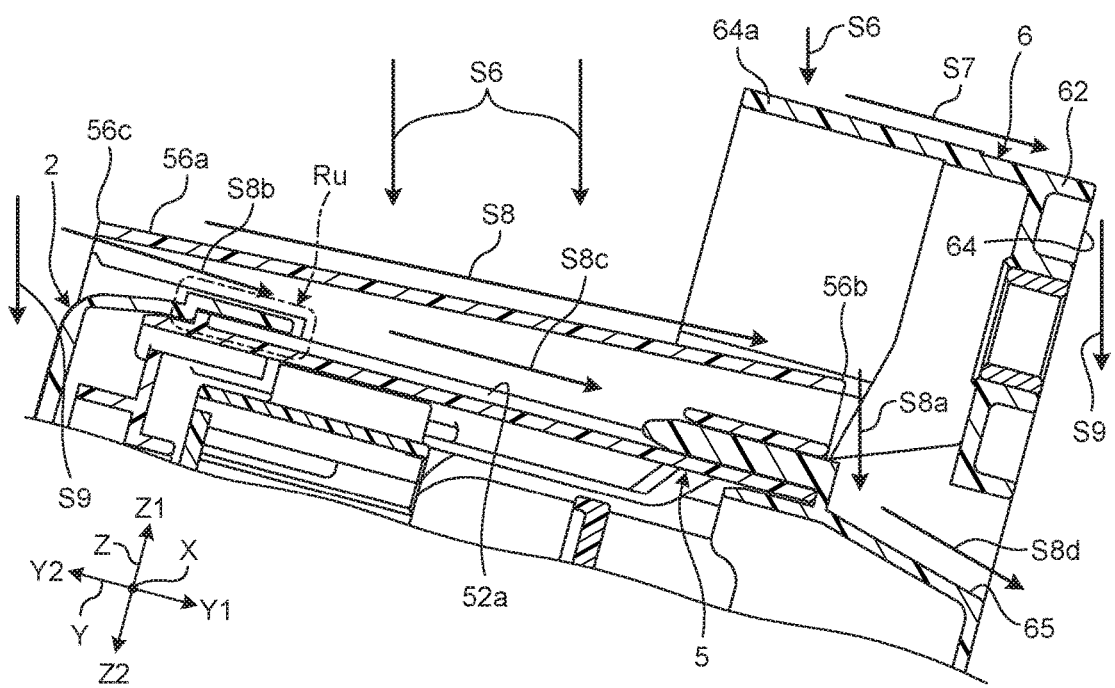
FIG. 7 is a partial cross-sectional view of the electric connection box according to the second embodiment.

Next, an electric connection box and a wire harness according to the second embodiment will be described. FIG. 5 is a partial perspective view of the electric connection box according to the second embodiment. FIG. 6 is a partial cross-sectional view of the electric connection box according to the second embodiment. FIG. 7 is a partial cross-sectional view of the electric connection box according to the second embodiment. The electric connection box 1 according to the second embodiment is different from the electric connection box 1 according to the first embodiment in the shape of the casing 4. It should be noted that repeated description of the configuration, operation, and effect common to the above-described first embodiment will not be provided as much as possible.

As illustrated in FIGS. 5 to 7, a casing 4 according to the second embodiment includes a water shielding member 56 formed on the outer circumferential surface 52a of the upward side end portion of the outer circumferential wall 52 of the casing main body 5. The water shielding member 56 faces the outer circumferential surface 52a of the upward side end portion in the vertical direction, and is formed on the upward side. That is, by the water shielding member 56, the casing 4 has a double wall structure at the end portion on the upward side. Therefore, the water shielding member 56 is disposed on the upward side in the vertical direction further than the upward side end portion boundary Ru, and is formed so as to at least partially overlap the upward side end portion boundary Ru as viewed in the vertical direction. The upward side end surface 56a of the water shielding member 56 is an inclined surface which is inclined downward from the closing direction side end portion 56b toward the opening direction side end portion 56c, that is, from the end portion on the casing cover 6 side toward the end portion on the cover 2 side, as viewed in the width direction. The casing 4 includes a water collection section 54 and a water passage section 55 in the casing main body 5.

The casing 4 has an extension portion 64 at an upward side end portion of the casing cover 6. The extension portion 64 is formed on the casing cover 6 to extend from the closing direction side of the water shielding member 56 to the upward side further than the water shielding member 56. In the second embodiment, the attaching portion 62 is the extension portion 64. The extension portion 64 has an end portion water shielding section 64a.

As viewed in the vertical direction, the end portion water shielding section 64a protrudes in the opening direction side of the extension portion 64, that is, from the end surface on the casing main body 5 side to the opening direction side, and is formed to at least overlap the end portion 56b of the water shielding member 56 on the closing direction side. As viewed in the closing direction, the end portion water shielding section 64a extends from the upward side end portion of the attaching portion 62 toward the end portion on the first housing region 4A1 side in the width direction of the upward side end surface 56a of the water shielding member 56. Furthermore, at the end portion, the end portion water shielding section 64a is formed to be bent downward in the vertical direction and to extend to the upward side end surface 56a.

Next, in a case where liquid is applied from the outside to the electric connection box 1 according to the second embodiment, the flow of liquid applied to the end portion on the upward side will be described with reference to FIGS. 6 and 7. First, a case where the up-down direction of the electric connection box 1 is a vertical direction will be described with reference to FIG. 6. First, liquid drops from the upward side toward the electric connection box 1 (arrow S6). The liquid applied to the upward side end portion of the attaching portion 62 of the casing cover 6, that is, the extension portion 64 moves in the closing direction or the opening direction (arrow S7). The liquid that has moved in the closing direction reaches the end portion of the attaching portion 62 on the closing direction side and moves downward on the outer side of the casing cover 6, that is, the outer side of the electric connection box 1 (arrow S9). Meanwhile, the liquid that has moved in the opening direction moves on the end portion water shielding section 64a to the opening direction side (arrow S7), reaches the end portion of the end portion water shielding section 64a on the opening direction side, and thereafter, the liquid moves downward, that is, drops (arrow S6). The liquid that has moved downward from the end portion water shielding section 64a reaches the upward side end surface 56a of the water shielding member 56. Further, due to the inclination provided on the upward side end surface 56a, the liquid is guided from the closing direction side end portion 56b toward the opening direction side end portion 56c (arrow S8). At this time, the liquid directly applied to the upward side end surface 56a of the water shielding member 56 also similarly moves in the downward direction from the closing direction side end portion 56b side to the opening direction side end portion 56c by the inclination (arrow S8). The liquid that has reached the opening direction side end portion 56c flows from the opening direction side end portion 56c to the end surface on the opening direction side of the cover 2, moves downward on the outer side of the cover 2, that is, on the outer side of the electric connection box 1, that is, drops (arrow S9).

Next, a case where the up-down direction of the electric connection box 1 has an angle with respect to the vertical direction, in particular, a case where the electric connection box 1 is inclined in the direction opposite to the inclination of the upward side end surface 56a of the water shielding member 56 will be described with reference to FIG. 7. Further, the above description is based on a case where the inclination angle of the electric connection box 1 is larger than the inclination angle of the upward side end surface 56a, and as viewed in the width direction, the electric connection box 1 is inclined downward from the opening direction side to the closing direction side. First, liquid drops from the upward side toward the electric connection box 1 (arrow S6). The liquid applied to the upward side end portion of the attaching portion 62 of the casing cover 6, that is, the extension portion 64 and the end portion water shielding section 64a moves in the closing direction in accordance with the inclination of the electric connection box 1 (arrow S7). The liquid that has moved in the closing direction reaches the end portion of the attaching portion 62 on the closing direction side, and moves downward on the outer side of the casing cover 6, that is, on the outer side of the electric connection box 1 (arrow S9). Meanwhile, according to the inclination of the electric connection box 1, the liquid dropped onto the upward side end surface 56a of the water shielding member 56 is guided on the upward side end surface 56a from the opening direction side end portion 56c side toward the closing direction side end portion 56b side (arrow S8). Further, the liquid that has reached the closing direction side end portion 56b moves downward (arrow S8a) from the closing direction side end portion 56b and moves toward an inclined plate provided on the casing cover 6, that is, drops. The inclined plate is an inclined plate having an inclination in the downward direction toward a discharge port 65 formed in the casing cover 6. The liquid dropped onto the inclined plate is guided to the discharge port 65 formed in the casing cover 6 by the inclination of the inclined plate, and is discharged from the discharge port 65 to the outside of the casing cover 6, that is, to the outside of the electric connection box 1 (arrow S8d).

Meanwhile, there is a case where some parts of the liquid (arrow S9) dropped downward to be adjacent to the cover 2 side or the liquid dropped near the opening direction side end portion 56c side may enter a gap between the end portion of the water shielding member 56 on the downward side and the end portion of the electric connection box 1 on the upward side (arrow S8b). The liquid that has entered the gap between the end portion of the water shielding member 56 on the downward side and the end portion of the electric connection box 1 on the upward side is guided downward along the inclination of the electric connection box 1 on the outer circumferential surface of the end portion of the electric connection box 1 on the upward side (arrow S8c). At this time, when the liquid enters the internal space portion 4A from the upward side end portion boundary Ru, the liquid is discharged to the outside of the electric connection box 1 by the water collection section 54 and the water passage section 55 as in the first embodiment. The liquid which has not entered the internal space portion 4A from the upward side end portion boundary Ru is guided in the closing direction on the outer circumferential surface 52a of the upward side end portion of the casing main body 5 and reaches the closing direction side end portion 56b. Further, the liquid having reached the closing direction side end portion 56b is discharged to the outside of the water shielding member 56 from the gap between the end portion of the water shielding member 56 on the downward side and the end portion of the electric connection box 1 on the upward side, and moves downward (arrow S8a). The liquid moved in the downward direction moves toward the inclined plate provided on the casing cover 6, is guided to the discharge port 65 formed in the casing cover 6 by the inclination of the inclined plate, and is discharged from the discharge port 65 to the outside of the casing cover 6, that is, to the outside of the electric connection box 1 (arrow S8d).

As described above, the electric connection box 1 according to the second embodiment has the water shielding member 56 formed on the upward side of the outer circumferential surface 52a of the upward side end portion of the casing main body 5 so as to overlap the upward side end portion boundary Ru as viewed in the vertical direction. That is, since the water shielding member 56 is formed to close the upward side end portion boundary Ru, it is possible to prevent the liquid applied to the electric connection box 1 from entering the internal space portion 4A from the upward side end portion boundary Ru. Even when the liquid applied to the electric connection box 1 enters the gap between the end portion of the casing 4 on the upward side and the end portion of the water shielding member 56 on the downward side and enters the internal space portion 4A from the upward side end portion boundary Ru, it is possible to suppress the dropping of the liquid by the water collection section 54 and the water passage section 55, and it is possible to discharge the liquid to the outside of the electric connection box 1 avoiding the electronic component 3.

Further, since the upward side end surface 56a of the water shielding member 56 is an inclined surface that is inclined from the closing direction side end portion 56b toward the downward side at the opening direction side end portion 56c, the liquid adhering to the upward side end surface 56a can be more reliably guided to the outside of the electric connection box 1.

Further, in the electric connection box 1 according to the second embodiment, the end portion water shielding section 64a formed in the extension portion 64 located at the upward side end portion of the casing cover 6 is formed to overlap the closing direction side end portion 56b of the water shielding member 56 as viewed in the vertical direction and protrude in the opening direction side. Therefore, it is possible to prevent the liquid from entering the gap between the end portion of the water shielding member 56 on the downward side and the end portion of the electric connection box 1 on the upward side from the gap between the closing direction side end portion 56b and the casing cover 6, and from reaching the upward side end portion boundary Ru.

Modified Example

Next, a modified example of the electric connection box 1 according to the second embodiment will be described. FIG. 8 is a partial perspective view of an electric connection box according to a modified example. The electric connection box 1 according to the modified example is different from the electric connection box 1 according to the second embodiment in that the water shielding member is attached to the casing main body 5 as a separate member.

The electric connection box 1 according to the modified example includes a water shielding member 7. As illustrated in FIG. 8, the water shielding member 7 is attached to the outer circumferential surface 52a of the upward side end portion of the outer circumferential wall 52 of the casing main body 5 by an attaching mechanism (not illustrated) formed on the outer circumferential surface 52a of the upward side end portion in a freely attachable and detachable manner. Further, the electric connection box 1 can attach and detach the cover 2 even in a state in which the water shielding member 7 is attached to the outer circumferential surface 52a of the upward side end portion. The water shielding member 7 faces the outer circumferential surface 52a of the upward side end portion in the vertical direction and is formed on the upward side. Therefore, similarly to the water shielding member 56 of the second embodiment, the water shielding member 7 is disposed on the upward side in the vertical direction further than the upward side end portion boundary Ru, and is disposed to at least partly overlap the upward side end portion boundary Ru as viewed in the vertical direction. The upward side end surface 71 of the water shielding member 7 is an inclined surface which is inclined downward from the closing direction side end portion toward the opening direction side end portion, that is, from the end portion on the casing cover 6 side toward the end portion on the cover 2 side, as viewed in the width direction.

As described above, since the electric connection box 1 according to the modified example is formed so that the water shielding member 7 closes the upward side end portion boundary Ru, it is possible to prevent the liquid applied to the electric connection box 1 from entering the internal space portion 4A from the upward side end portion boundary Ru. Further, even when the liquid applied to the electric connection box 1 enters the gap between the end portion of the casing 4 on the upward side and the end portion of the water shielding member 7 on the downward side and enters the internal space portion 4A from the upward side end portion boundary Ru, it is possible to suppress the dropping of liquid by the water collection section 54 and the water passage section 55, and to discharge the liquid to the outside of the electric connection box 1 avoiding the electronic component 3. Further, since the upward side end surface 71 of the water shielding member 7 is an inclined surface that is inclined from the closing direction side end portion toward the downward side in the opening direction side end portion, the liquid adhering to the upward side end surface 71 can be more reliably guided to the outside of the electric connection box 1.

In the electric connection box 1 according to the first embodiment, the water passage walls 53b and 53c are formed to extend toward the opening direction side so as to be located on the same plane as the electronic component 3 housed in the internal space portion 4A in the vertical direction as viewed in the width direction. However, the embodiment is not limited thereto, and the water passage walls 53b and 53c may be formed to extend so as to protrude more in the opening direction side than the electronic component 3. That is, as viewed in the width direction, the water passage walls 53b and 53c may protrude at least on the same plane in the vertical direction as the electronic component 3 housed in the internal space portion 4A in the opening direction side.

The electric connection box 1 in the second embodiment has a structure including the water shielding member 56, the extension portion 64 and the end portion water shielding section 64a. However, when the extension portion 64 is not required, a structure having only the water shielding member 56 may be adopted. For example, when the electric connection box 1 is installed in the installation target, in a case where another member on the side of the vehicle body is located in the upward direction of the electric connection box 1 and the liquid adheres to the opening direction side than the position at which the end portion water shielding section 64a is formed as viewed in the vertical direction, it is possible to select whether only the water shielding member 56 is provided, or the extension portion 64 and the end portion water shielding section 64a are provided, as required.

In the electric connection box and the wire harness according to each of the present embodiments, the liquid entering the internal space portion from the upward side end portion boundary between the casing and the cover can be collected by a water collection section and guided to a water passage section, and the liquid guided to the water passage section can be guided in the vertically downward direction along the water passage section and discharged from the downward side of the boundary between the casing and the cover to the outside of the electric connection box. Thus, it is possible to discharge the liquid entering the internal space portion to the outside of the casing, while avoiding the electronic components.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric connection box comprising:
    a casing having a plurality of walls that define an internal space portion and a cover side opening portion, the cover side opening portion in communication with the internal space portion;
    a plurality of electronic components housed in the internal space portion; and
    a cover that closes the cover side opening portion, wherein
    the casing is installed on an installation target such that a closing direction of the cover with respect to the cover side opening portion is a direction orthogonal to a vertical direction,
    the internal space portion is partitioned into a first housing region and a second housing region by a rib formed on the casing to extend in the vertical direction, in a width direction orthogonal to the vertical direction and the closing direction,
    the rib extends in an opening direction side which is a direction opposite to the closing direction, and includes a water passage section formed between the rib and a water passage wall opposite the rib in the width direction,
    of both end portions of the water passage section in the vertical direction, an upward side end portion communicates with a water collection section provided in the casing, and a downward side end portion communicates with an outside of the casing, and
    the water collection section includes a guide wall which overlaps an upward side end portion boundary which is a boundary located at an upward side end portion, of the boundary between the casing and the cover as viewed in the vertical direction, the guide wall being disposed on the upward side of the first housing region and the second housing region, and connected to the water passage wall.

2. The electric connection box according to claim 1, further comprising:
    a water shielding member which is disposed on an upward side in the vertical direction further than the upward side end portion boundary, and at least a part of which overlaps the upward side end portion boundary as viewed in the vertical direction.

3. The electric connection box according to claim 2, wherein
    the water shielding member is an inclined surface in which an upward side end surface in the vertical direction is inclined downward from a closing direction side end portion toward an opening direction side end portion.

4. The electric connection box according to claim 3, wherein
    the casing includes an extension portion extending from the closing direction side of the water shielding member toward the upward direction side further than the water shielding member, and
    the extension portion is formed such that an end portion water shielding section at least overlapping the closing direction side end portion of the water shielding member protrudes in the opening direction as viewed in the vertical direction.

5. A wire harness comprising:
    an electric wire; and
    an electric connection box, connected to the wire, that includes a casing having a plurality of walls that define an internal space portion and a cover side opening portion, the cover side opening portion in communication with the internal space portion, a plurality of electronic components housed in the internal space portion, and a cover that closes the cover side opening portion, wherein
    the casing is installed on an installation target such that a closing direction of the cover with respect to the cover side opening portion is a direction orthogonal to a vertical direction,
    the internal space portion is partitioned into a first housing region and a second housing region by a rib formed on the casing to extend in the vertical direction, in a width direction orthogonal to the vertical direction and the closing direction,
    the rib extends in an opening direction side which is a direction opposite to the closing direction, and includes a water passage section formed between the rig and a water passage wall opposite the rib in the width direction,
    of both end portions of the water passage section in the vertical direction, an upward side end portion communicates with a water collection section provided in the casing, and a downward side end portion communicates with an outside of the casing, and
    the water collection section includes a guide wall which overlaps an upward side end portion boundary which is a boundary located at an upward side end portion, of a boundary between the casing and the cover as viewed in the vertical direction, the guide wall being disposed on the upward side of the first housing region and the second housing region, and connected to the water passage wall.

* * * * *